United States Patent
Stockman et al.

[11] Patent Number: 5,909,051
[45] Date of Patent: *Jun. 1, 1999

[54] MINORITY CARRIER SEMICONDUCTOR DEVICES WITH IMPROVED STABILITY

[75] Inventors: Stephen A. Stockman, San Jose; Daniel A. Steigerwald, Cupertino; Changhua Chen, San Jose, all of Calif.

[73] Assignee: Hewlett-Packard Company, Palo alto, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/802,183

[22] Filed: Feb. 18, 1997

Related U.S. Application Data

[63] Continuation of application No. 08/463,371, Jun. 5, 1995, abandoned.

[51] Int. Cl.$^6$ .......................... H01L 33/00; H01L 29/167
[52] U.S. Cl. .......................... 257/610; 257/611; 257/612; 257/96; 257/102
[58] Field of Search .................. 257/609–612, 257/94, 96, 13, 607, 102, 86

[56] References Cited

U.S. PATENT DOCUMENTS

| 3,806,774 | 4/1974 | Hartman et al. | 257/102 |
|---|---|---|---|
| 3,812,516 | 5/1974 | Hayashi | 257/96 |
| 3,936,322 | 2/1976 | Blum et al. | 257/611 |
| 4,160,261 | 7/1979 | Casey, Jr. et al. | 257/192 |
| 4,297,783 | 11/1981 | Casey, Jr. et al. | 257/609 |
| 4,610,731 | 9/1986 | Chevallier et al. | 257/609 |
| 4,719,497 | 1/1988 | Tsai | 257/609 |

FOREIGN PATENT DOCUMENTS 54-152485  11/1979  Japan ..................................... 257/86

*Primary Examiner*—John Guay

[57] ABSTRACT

A method for improving the operating stability of compound semiconductor minority carrier devices and the devices created using this method are described. The method describes intentional introduction of impurities into the layers adjacent to the active region, which impurities act as a barrier to the degradation process, particularly undesired defect formation and propagation. A preferred embodiment of the present invention uses O doping of III–V optoelectronic devices during an epitaxial growth process to improve the operating reliability of the devices.

11 Claims, 5 Drawing Sheets

MINORITY CARRIER SEMICONDUCTOR DEVICES WITH IMPROVED STABILITY

CROSS REFERENCE TO RELATED APPLICATION

This is a continuation of application Ser. No. 08/463,371 filed on Jun. 5, 1995, now abandoned.

BACKGROUND OF THE INVENTION

This invention is in the field of minority carrier semiconductor devices. The invention relates in particular to methods for improving the operating stability of light emitting semiconductor devices by the intentional introduction of impurities and the devices created using these methods.

Degradation of semiconductor minority carrier devices typically involves an increase in the non-radiative recombination efficiency of the device during the device's operation. The causes of this degradation depend on the type of device, its structure, materials, and operating conditions.

A known double heterostructure light emitting diode ("LED") is shown in FIG. 1. LED 10 is comprised of an optically transparent GaP window/current spreading/contact layer 12, high bandgap AlInP upper confining/injection layer 14, a lower bandgap $(Al_xGa_{1-x})_{0.5}In_{0.5}P$ active layer 16, high bandgap AlInP lower confining/injection layer 18, and conductive substrate 20, which may be formed from GaAs or GaP. P-type contact 21 and n-type contact 23 complete the LED. Light extraction occurs through both the top surface and sides of the LED. The layers are generally doped so that the p-n junction is located near or within the active layer, and ohmic contacts 21 and 23 are made to the p-type and n-type regions of the device. The structure may be grown by any of a variety of methods including metal-organic chemical vapor deposition("MOCVD"), vapor phase epitaxy("VPE"), liquid phase epitaxy("LEP"), molecular beam epitaxy ("MBE"), and others.

FIG. 2 is an energy band diagram of the LED shown in FIG. 1. When forward biased, efficient injection of the minority carriers into active layer 16 is achieved by careful placement of the p-n junction. The minority carriers are confined within the active layer of the LED by high bandgap confining layers 14 and 18. The recombination process consists of both radiative recombination which produces the desired light emission and non-radiative recombination, which does not produce light. Non-radiative recombination may result from crystal imperfections within the LED as well as other causes. Light is extracted from the LED through the LED's various transparent layers and surfaces and is focussed into a usable pattern by various reflectors and lenses(not shown).

The LED illustrated in FIG. 1 is only one example of a minority carrier device. A variety of other minority carrier devices, including bipolar transistors, photodetectors, and solar cells operate on similar physical principles. Semiconductor lasers often have a double heterostructure and similarly experience the competition between radiative and non-radiative recombination. The performance and stability of all these devices depends upon maintaining a long carrier recombination lifetime throughout the operating life of the device.

For the LED of FIG. 1, the output power is directly proportional to the internal quantum efficiency and can be expressed as:

$$\eta_{external} \eta_{internal} [1+(\tau_r/\tau_{nr})]^{-1},$$

where $\eta_{internal}$ is the internal quantum efficiency, $\eta_{external}$ is the external quantum efficiency, $\tau_r$ is the radiative recombination lifetime, and $\tau_{nr}$ is the non-radiative recombination lifetime. $\tau_{nr}$ is inversely related to the number of non-radiative recombination centers in the active region. The relationship $\eta_{external}$ and the concentration of non-radiative recombination centers is illustrated by the graph shown in FIG. 3, which shows the external quantum efficiency $\eta_{external}$ decreasing as the concentration of non-radiative recombination centers increases. A variety of crystal defects can act as non-radiative recombination centers, including substitutional or interstitial impurities such as Cr, Cu, Au, Fe, O and even such shallow dopants as Si, S, Se, native point defects such as self-interstitials and vacancies, impurity or dopant related complexes and precipitates, surface and interface states, and dislocations and other extended defects. These defects can arise during the growth process due to incorporation of residual impurities or epitaxial defect formation.

A minority carrier device can degrade during operation for several reasons. In an LED, the carrier injection efficiency or light extraction efficiency can change depending on the particular device structure and the operating conditions. The most common cause of decreased device efficiency is an increase in the non-radiative recombination efficiency caused by the formation of defects in the active region during stress. This process results in the gradual degradation of device characteristics over time, as illustrated by the graph shown in FIG. 4. The graph shows that $\eta_{external}$, the external quantum efficiency, decreases as the period of time the device is under stress increases.

A variety of physical processes contribute to the increase in non-radiative recombination centers in the active region during LED operation. Recombination enhanced or photo-enhanced defect reactions within the active region or at nearby edges or interfaces can contribute to the increase. Other processes include the diffusion or propagation of impurities, native point defects, dopants, and dislocations (also known as dark line defects) into the active layer from other regions of the device. These defects and residual or unintentional impurities have always been considered as detrimental to device performance and great efforts have been expended trying to minimize the concentration of these defects and impurities.

SUMMARY OF THE INVENTION

A first preferred embodiment of the present invention comprises a method for improving the operating stability of minority carrier semiconductor devices by the intentional introduction of impurities into the layers adjacent to the active region, which impurities act as a barrier to the degradation process, particularly undesired defect formation and propagation. The semiconductor devices produced using this method also comprise this first embodiment of the invention. In a particular example of this first preferred embodiment, impurities are introduced by intentionally doping III–V optoelectronic semiconductor devices with oxygen("O") during an epitaxial growth step. Normally, O is considered an efficient deep level trap, and undesirable in an optoelectronic device. However, as will be described in more detail below, using O in the manner described herein improves device reliability without loss of device efficiency.

The present invention will now be described in detail with reference to the drawings listed and described below.

BRIEF DESCRIPTION OF THE ILLUSTRATIONS

DETAILED DESCRIPTION OF THE PREFERRED EMBODIMENTS

Figure 1:
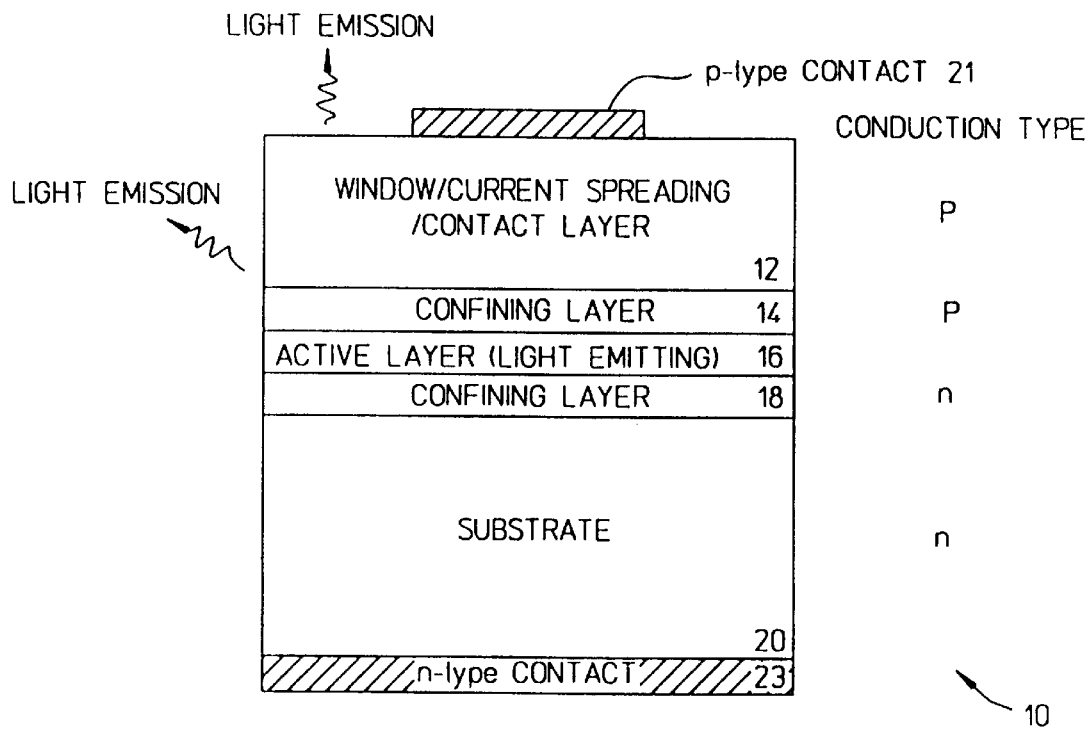
FIG. 1 is a cross-sectional drawing of a known light emitting semiconductor device.
Figure 2:
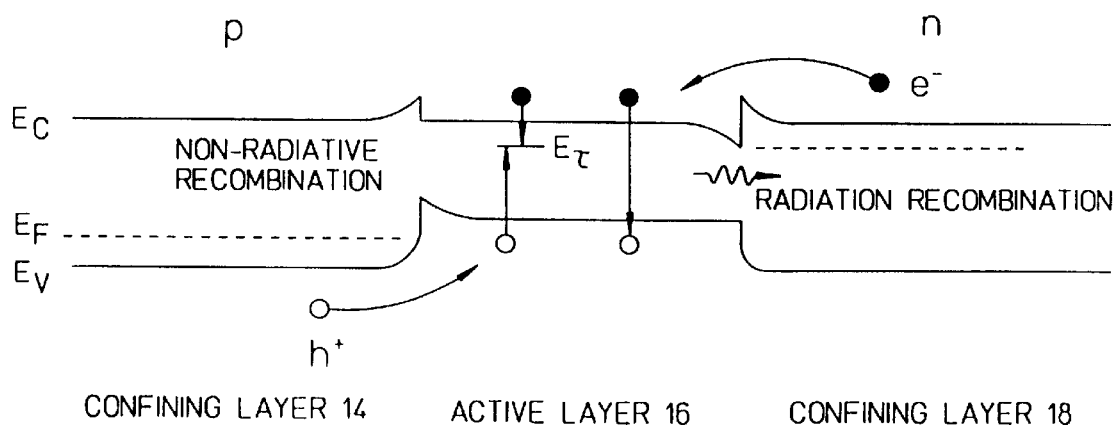
FIG. 2 is an energy band diagram of the light emitting semiconductor device shown in FIG. 1.
Figure 3:
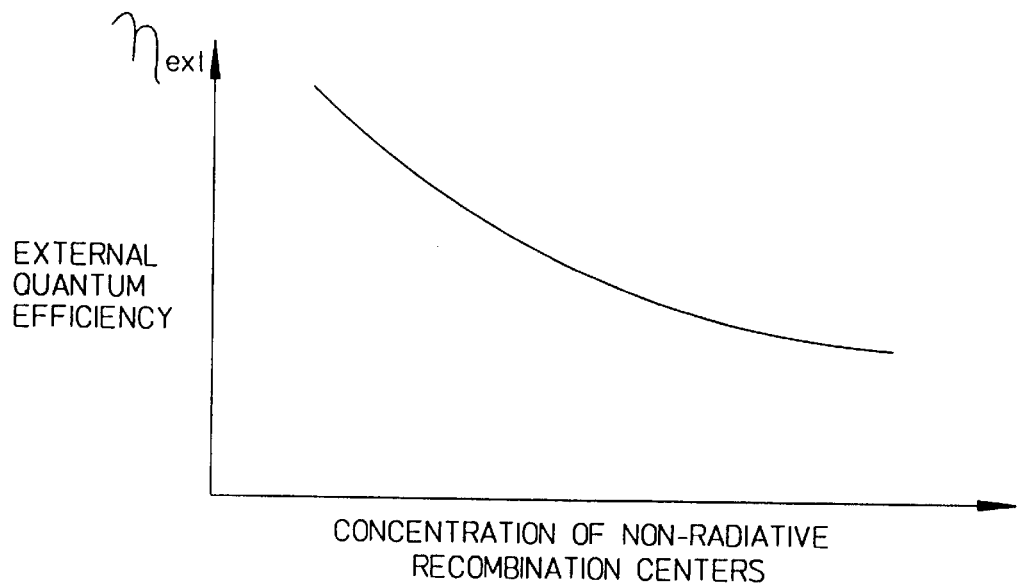
FIG. 3 is a graph of the concentration of non-radiative recombination centers versus the external quantum efficiency of the device shown in FIG. 1.
Figure 4:
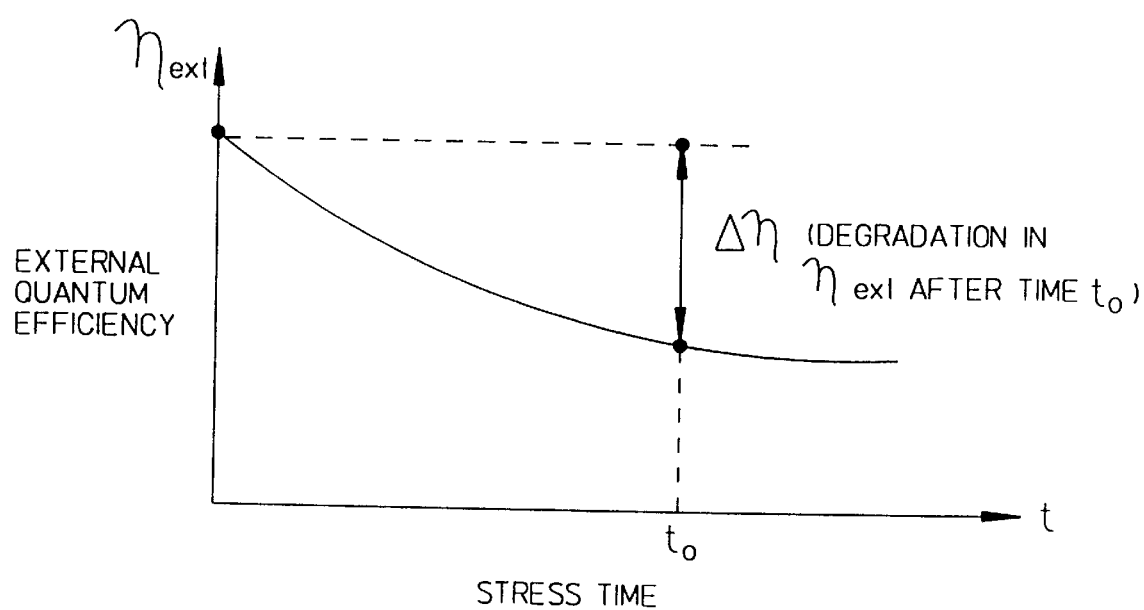
FIG. 4 is a graph of the stress time versus the external quantum efficiency of the device shown in FIG. 1.

High efficiency visible LEDs can be made using an $(Al_xGa_{1-x})_{0.5}In_{0.5}P$ material system. Such devices are structurally similar to the LED shown in FIG. 1. The substrate is typically either GaAs or GaP, the confining layers are $(Al_xGa_{1-x})_{0.5}In_{0.5}P$ ($0<X\leq1$), the active layer is $(Al_yGa_{1-y})_{0.5}In_{0.5}P$ ($0\leq Y\leq1$) and the window layer is an optically transparent and electrically conductive material such as AlGaAs or GaP. The most commonly used epitaxial growth technique for these materials is MOCVD. In these materials, O incorporation occurs easily in the alloys containing Al and leads to undesirable deep level defects which cause efficient non-radiative recombination, resulting in low initial $\eta_{external}$. Several techniques are used to minimize O incorporation in these alloys, including growth at high substrate temperatures, use of a substrate orientation which reduces O incorporation efficiency, and growth with a high phosphorus overpressure (high V/III ratio).

The amount of O in the epitaxial structure has a major impact not only on the LED efficiency, but also on device reliability.

Figure 5:
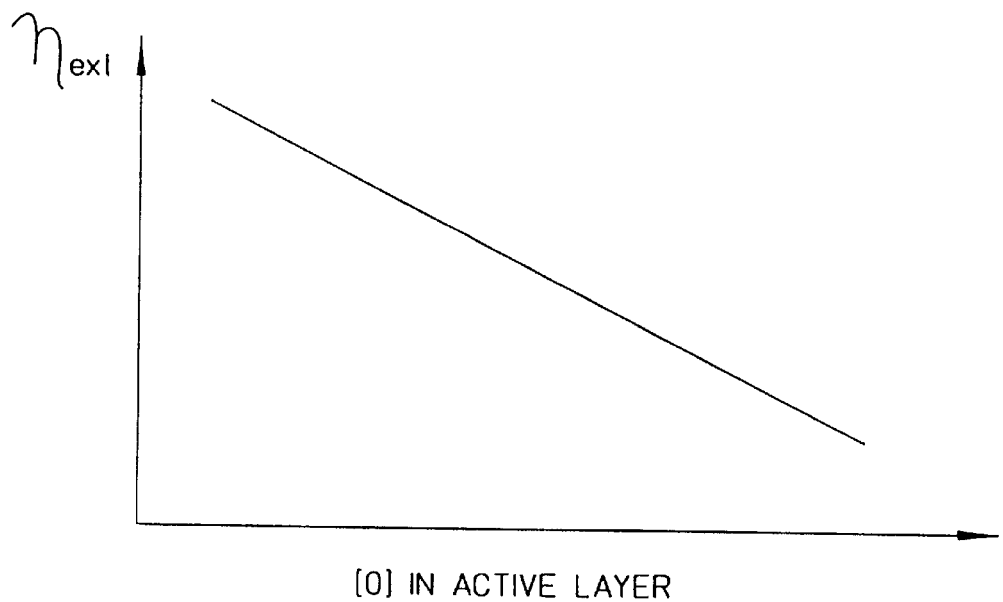
FIG. 5 shows the effect of O in the active layer on $\eta_{external}$.
Figure 6:
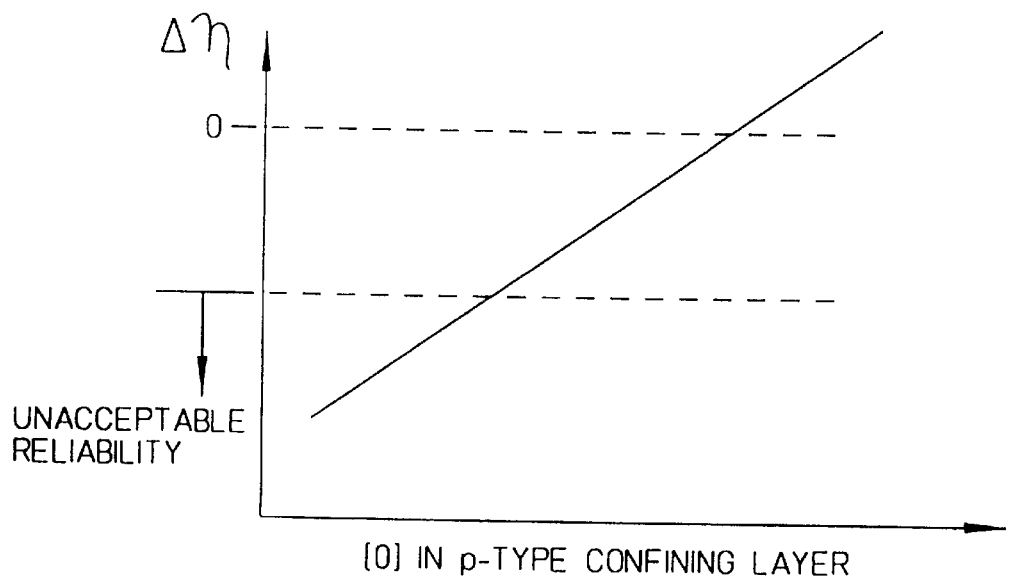
FIG. 6 shows the effect of O in the p-type confining layer on $\Delta\eta_{external}$.

Experiments with independently varying the O concentration in each of the various layers of the epitaxial structure, using intentionally controlled O incorporation, with the O levels being kept low enough so that the O doped layers remain conductive, showed that device efficiency depends on the O concentration in the active region. However, device reliability depends on the amount of O in the p-type confining layer. These results are shown in FIGS. 5 and 6. The graph in FIG. 5 indicates that $\eta_{external}$ decreases with increasing O in the active layer. FIG. 6 shows that as O in the p-type confining layer increases, degradation of the LED is reduced. The trend of decreasing $\eta_{external}$ with increasing O content in the active layer was expected, as O is known to form a deep trap which contributes to non-radiative recombination in the $(Al_xGa_{1-x})_{0.5}In_{0.5}P$ active region. However, the result of improved device stability with increasing O content in the p-type upper confining layer was not expected. These results permit the simultaneous optimization of the device's efficiency and reliability by correctly adjusting the O profile of the epitaxial structure.

As the precise nature of the LED degradation mechanism is unknown, the precise reason that this O doping improves device stability is also unknown. The O may tie up or slow down the propagation of other impurities, native point defects, substitutional or interstitial dopants, or dislocations which would otherwise be free to propagate into the active region from the confining layers, substrate, metal contacts, mismatched interfaces, edges, or epitaxial defects, causing device degradation.

In III–V semiconductor materials, O can be a deep level impurity, a reactive impurity which may getter or passivate other impurities, or a shallow compensating impurity. The improvement in device reliability described herein is due to one or more of these properties. Similar results could be achieved by choosing other typically undesired impurities with similar properties. Other deep level impurities include the transition metals, such as Cr, Fe, Co, Cu, Au, etc. Other reactive impurities which have gettering or passivating properties include H, C, S, Cl, and F. The choice of shallow compensating impurities depends on the conduction type of semiconductor material. In a p-type region, shallow compensating impurities are shallow donors and in an n-type region, shallow compensating impurities are shallow acceptors. In p-type III–V semiconductors, shallow compensating impurities are the elements in columns IVB and VIB of the periodic table, particularly the donors O, S, Se, Te, C, Si, Ge, and Sn.

Figure 7:
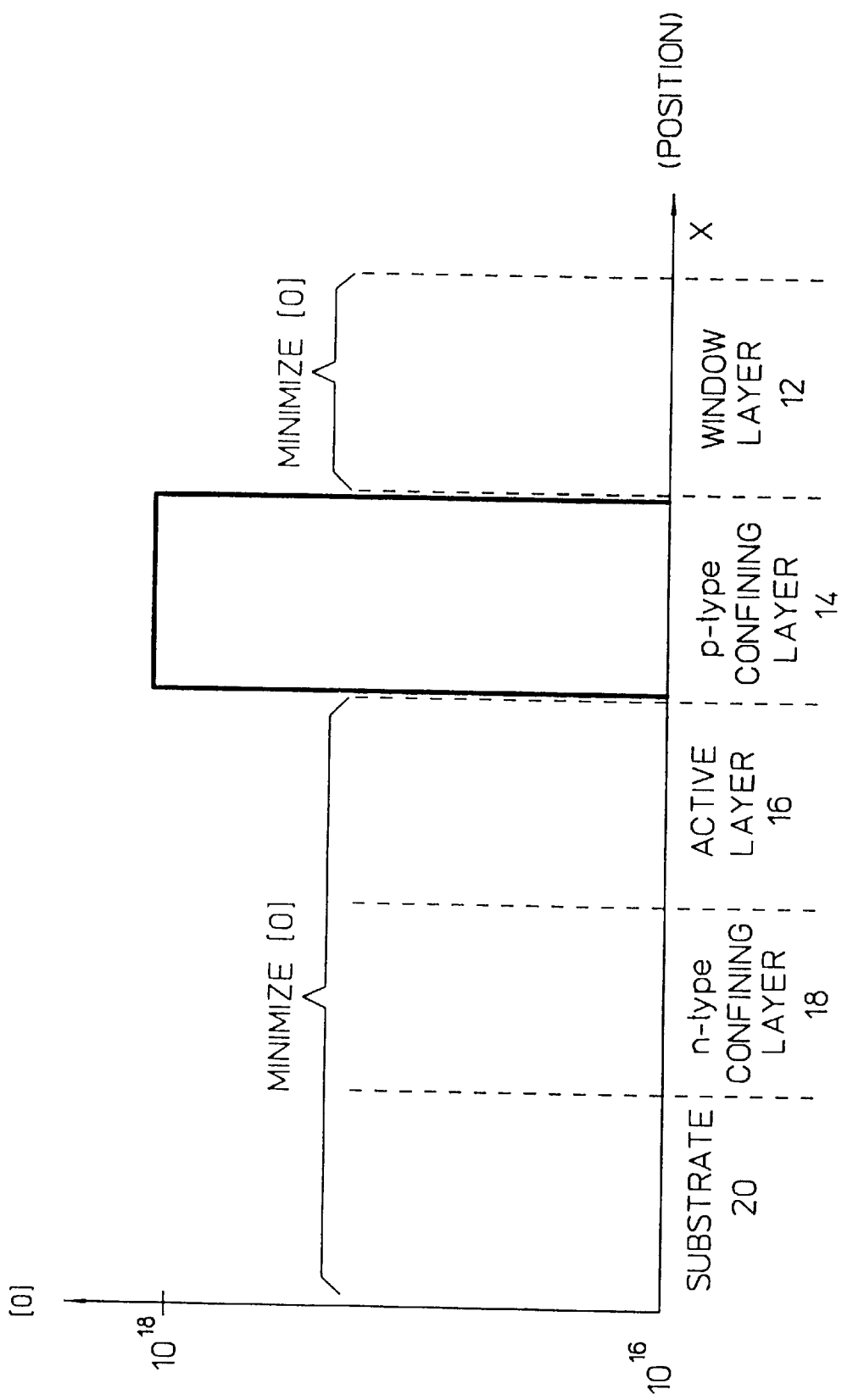
FIG. 7 is a graph showing the concentration of oxygen in each of the layers of a semiconductor device as taught by the first preferred embodiment of the present invention.

A schematic diagram of the first preferred embodiment of the present invention is shown in FIG. 7. Some or all of the available methods to minimize O concentration in the structure are used, with emphasis on keeping active layer 16 as O free as possible. In the case of MOCVD, techniques for reducing O include high growth temperature, high P overpressure, proper substrate orientation[(100) misoriented toward (111)A, for example], source purity, reactor cleanliness, leak integrity, etc.

In the case of $(Al_xGa_{1-x})_{0.5}In_{0.5}P$ LEDs, an O doping source is then used to controllably introduce O into the p-type confining layer 14 to improve reliability. Depending on the dominant degradation mechanism and device configuration, other layers may be doped in other devices. The O doping source could be $O_2$, $H_2O$, alkoxide sources such as dimethyl aluminummethoxide and/or diethyl aluminumethoxide, or other O bearing compounds. Improved device stability occurs when the p-type confining layer 14 is doped with O at a concentration of at least $1\times10^{16}cm^{-3}$ and up to $5\times10^{19}cm^{-3}$. Best results occur when p-type confining layer 14 is doped with a concentration of O of about $1\times10^{18}cm^{-3}$. The upper limit of O doping in this material system is determined by the conducting/insulating transition in the confining layer. In other devices and material systems these ranges will of course vary. In some applications it may be desirable to vary the O profile within the p-type confining layer.

Figure 8:
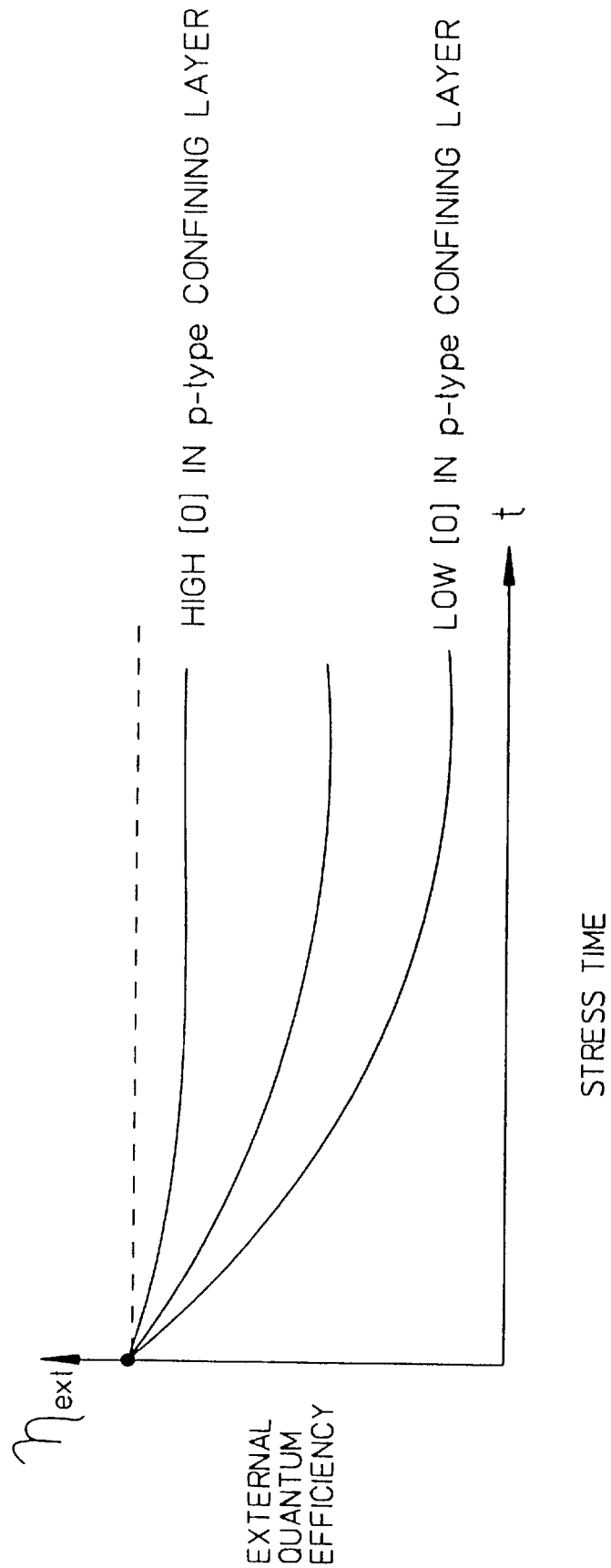
FIG. 8 is a graph of the external quantum efficiency $\eta_{external}$ of devices constructed according to the present invention versus stress time.

The careful optimization of the O profile for the device shown in FIG. 7 results in improved device reliability while maintaining high initial $\eta_{external}$. This is illustrated by the graphs shown in FIG. 8 which illustrate how higher concentrations of O in the p-type confining layer 14 result in higher $\eta_{external}$ after stress is applied for an increasing period of time.

In this preferred embodiment, O is introduced as part of the epitaxial growth process. Other methods, such as implantation or diffusion, can also be used.

Before the research which lead to the present invention, O doping of III–V semiconductors was only used for studying O related deep level defects and for growing semi-insulating materials. As stated previously, O in the active region has always been known to lower efficiency. No previously known literature suggested the use of O doping into a confining layer to improve device performance. The teachings of the present invention could further be used in the fabrication of semiconductor lasers, photodetectors, solar cells, bipolar junction transistors and other minority carrier semiconductor devices.

What is claimed is:

1. A minority carrier semiconductor device comprising:
   an active region with a predefined minority carrier recombination lifetime;
   at least one conductive region adjacent to the active region, the adjacent conductive region being doped with oxygen and maintaining the predefined minority carrier recombination lifetime in the active region during device operation;
   an electrical contact; and
   a contact layer, interposing the adjacent conductive region and the electrical contact.

2. The minority carrier semiconductor device of claim 1 wherein the active region comprises a light emitting region of a light emitting diode and the adjacent region comprises an injection region of a light emitting diode.

3. The minority carrier semiconductor device of claim 1 wherein the active region comprises a light emitting region of a double heterostructure light emitting diode and the adjacent region comprises a confining layer of the double heterostructure light emitting diode.

4. The minority carrier semiconductor device of claim 3 wherein the doping concentration of oxygen is between $1\times10^{16} cm^{-3}$ and $5\times10^{19} cm^{-3}$.

5. A light emitting semiconductor device comprising:
   a substrate;
   a first confining layer overlying the substrate;
   an active region for generating light wherein the radiative recombination efficiency is predefined overlying the first confining layer;
   a second confining layer, the second confining layer overlying the active region;
   window layer overlying the second confining layer; and
   electrical contacts deposited on the substrate and the window layer, at least one confining layer doped with oxygen, the doped confining layer remaining conductive and decreasing the loss of radiative recombination efficiency that the device experiences under operating stress.

6. The light emitting semiconductor device of claim 5 wherein the second confining layer is p-type, and the doping concentration of the oxygen in the p-type confining layer is between $1\times10^{16} cm^{-3}$ and $5\times10^{19} cm^{-3}$.

7. The light emitting semiconductor device of claim 6 wherein the doping concentration of the oxygen in the p-type confining layer is approximately $1\times10^{18} cm^{-3}$.

8. In a minority carrier semiconductor device comprising at least an active region and at least one adjacent region, a method for improving the reliability of the device comprising the step of doping the at least one adjacent region with oxygen, the doping decreasing the degradation in performance that the device experiences under operating stress and leaving the adjacent region conductive.

9. The method of claim 8 wherein the active region comprises a light emitting region of a light emitting diode and the adjacent region comprises an injection layer of a light emitting diode.

10. The method of claim 9 wherein the active region further comprises a double heterostructure light emitting diode and the adjacent region further comprises a confining layer of the double heterostructure light emitting diode.

11. The method of claim 10 wherein the doping concentration of oxygen is between $1\times10^{16} cm^{-3}$ and $5\times10^{19} cm^{-3}$.

* * * * *